United States Patent
Okai

(10) Patent No.: US 8,507,893 B2
(45) Date of Patent: Aug. 13, 2013

(54) ELECTRONIC DEVICE, LIGHT-RECEIVING AND LIGHT-EMITTING DEVICE, ELECTRONIC INTEGRATED CIRCUIT AND OPTICAL INTEGRATED CIRCUIT USING THE DEVICES

(75) Inventor: Makoto Okai, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 270 days.

(21) Appl. No.: 13/003,323

(22) PCT Filed: May 26, 2009

(86) PCT No.: PCT/JP2009/002305
§ 371 (c)(1),
(2), (4) Date: Jan. 10, 2011

(87) PCT Pub. No.: WO2010/004681
PCT Pub. Date: Jan. 14, 2010

(65) Prior Publication Data
US 2011/0108805 A1    May 12, 2011

(30) Foreign Application Priority Data
Jul. 11, 2008  (JP) ................................ 2008-180863

(51) Int. Cl.
*H01L 29/06* (2006.01)
*H01L 29/78* (2006.01)

(52) U.S. Cl.
USPC .............. 257/27; 257/328; 977/734; 977/755

(58) Field of Classification Search
USPC ....... 257/26, 27, 29; 977/734, 755; 677/734, 677/755
See application file for complete search history.

(56) References Cited

U.S. PATENT DOCUMENTS

| | | | |
|---|---|---|---|
| 6,869,581 B2 * | 3/2005 | Kishi et al. ................. | 423/447.6 |
| 7,015,142 B2 * | 3/2006 | DeHeer et al. ................ | 438/689 |
| 7,071,258 B1 * | 7/2006 | Jang et al. .................... | 524/496 |
| 7,732,859 B2 * | 6/2010 | Anderson et al. ............. | 257/328 |

(Continued)

FOREIGN PATENT DOCUMENTS

JP    2003-159699    6/2003

OTHER PUBLICATIONS

Novoselov et al., "Two-Dimensional Gas of Massless Dirac Fermions in Graphene," Nature, 2005, pp. 197-200, vol. 438, Nature publishing group.

(Continued)

*Primary Examiner* — David Vu
*Assistant Examiner* — Earl Taylor
(74) *Attorney, Agent, or Firm* — Antonelli, Terry, Stout & Kraus, LLP.

(57) ABSTRACT

Provided are an electronic device and a light-receiving and light-emitting device which can control the electron configuration of a graphene sheet and the band gap thereof, and an electronic integrated circuit and an optical integrated circuit which use the devices. By shaping the graphene sheet into a curve, the electron configuration thereof is controlled. The graphene sheet can be shaped into a curve by forming the sheet on a base film having a convex structure or a concave structure. The local electron states in the curved part can be formed by bending the graphene sheet. Thus, the same electron states as the cylinder or cap part of a nanotube can be realized, and the band gaps at the K points in the reciprocal lattice space can be formed.

16 Claims, 4 Drawing Sheets

(56) References Cited

U.S. PATENT DOCUMENTS

| | | | |
|---|---|---|---|
| 7,781,061 B2* | 8/2010 | Garcia et al. | 428/402 |
| 7,790,242 B1* | 9/2010 | Sumanasekera et al. | 427/458 |
| 8,274,098 B2* | 9/2012 | Chung et al. | 257/192 |
| 2003/0098640 A1* | 5/2003 | Kishi et al. | 313/309 |
| 2006/0099750 A1* | 5/2006 | DeHeer et al. | 438/194 |
| 2007/0001220 A1* | 1/2007 | Tombler et al. | 257/330 |
| 2007/0158618 A1* | 7/2007 | Song et al. | 252/500 |
| 2007/0284557 A1* | 12/2007 | Gruner et al. | 252/500 |
| 2009/0020764 A1* | 1/2009 | Anderson et al. | 257/77 |
| 2009/0029221 A1* | 1/2009 | Goddard et al. | 429/30 |
| 2010/0055388 A1* | 3/2010 | Chen et al. | 428/119 |
| 2010/0127312 A1* | 5/2010 | Grebel et al. | 257/288 |
| 2010/0200840 A1* | 8/2010 | Anderson et al. | 257/29 |
| 2010/0307900 A1* | 12/2010 | Choi et al. | 200/330 |
| 2011/0108805 A1* | 5/2011 | Okai | 257/26 |
| 2012/0112166 A1* | 5/2012 | Lin et al. | 257/29 |
| 2012/0205606 A1* | 8/2012 | Lee et al. | 257/2 |

OTHER PUBLICATIONS

Son et al., "Half-Metallic Graphene Nanoribbons," Nature, 2006, pp. 347-342, vol. 444, Nature publishing group.

Inokawa et al., "Field-Effect Transistor With Deposited Graphite Thin Film," Japanese Journal of Applied Physics, 2007, pp. 2615-2617, vol. 46, No. 4B.

Gu et al., "Field Effect in Epitaxial Graphene on a Silicon Carbide Substrate," Applied Physics Letters, 2007, pp. 253507-1-253507-3, vol. 90.

* cited by examiner

ELECTRONIC DEVICE, LIGHT-RECEIVING AND LIGHT-EMITTING DEVICE, ELECTRONIC INTEGRATED CIRCUIT AND OPTICAL INTEGRATED CIRCUIT USING THE DEVICES

TECHNICAL FIELD

The present invention relates to an electronic device and a light-receiving and light-emitting device having a graphene sheet, and an electronic integrated circuit and an optical integrated circuit which use the devices.

BACKGROUND ART

A two-dimensional structure in which carbon atoms are regularly arranged in hexagon configuration is called a graphene sheet. A substance formed by stacking a plurality of the graphene sheets is called graphite. The graphene sheet and the graphite have been known. A single sheet of graphene sheet can have been taken out onto a substrate recently (for example, see Non patent document 1), so that the graphene sheet has suddenly attracted attention.

A graphene sheet shows metallic properties because a $\pi$ band and a $\pi^*$ band contact at the K points in the reciprocal lattice space. Therefore, the graphene sheet is not applicable for electronic devices such as transistors or light-receiving and light-emitting devices such as LEDs.

A lot of computations have been done, and as a result it has been shown that a band gap is generated when a size or an edge structure of a graphene sheet satisfies certain conditions (for example, see Non patent document 2).

However, methods for controlling the band gap using microfabrication technologies have not been found.

PRIOR ART DOCUMENT

Non Patent Document

Non patent document 1: Nature 438, 197 (2005)
Non patent document 2: Nature 444, 347 (2006)

DISCLOSURE OF THE INVENTION

Problem to be Solved by the Invention

An object of the present invention is to provide an electronic device and a light-receiving and light-emitting device which can control the electron configuration of a graphene sheet and the band gap thereof, and an electronic integrated circuit and an optical integrated circuit which use the device.

Means for Solving the Problem

Accordingly, an electronic device of the present invention comprises a substrate; an electrode disposed on the substrate; a base layer disposed on the substrate and having at least one of convex structures or concave structures; and at least one layer of graphene sheets which is disposed along the convex structure or the concave structure of the base layer and directly connected to the electrode or disposed through an insulating layer.

In addition, a light-receiving and light-emitting device of the present invention comprises a substrate; an electrode disposed on the substrate; a base layer disposed on the substrate and having at least one of convex structures or concave structures; and at least one layer of graphene sheets which is disposed along the convex structure or the concave structure of the base layer and connected to the electrode.

An electronic integrated circuit of the present invention is characterized by integrating the electronic devices on a semiconductor substrate or a flexible printed circuit.

An optical integrated circuit of the present invention is characterized by integrating the light-receiving and light-emitting devices on a semiconductor substrate or a flexible printed circuit.

In the present invention, a graphene sheet means a two-dimensional structure in which carbon atoms are regularly arranged in hexagon configuration.

The graphene sheet shows metallic properties because a $\pi$ band and a $\pi^*$ band are contacted at the K points in the reciprocal lattice space. When a graphene sheet can obtain semiconductor-like properties (in other words, electron states having an existence of a band gap) by controlling the electron configuration, the graphene sheet is applicable for electronic devices such as field effect transistors and light-receiving and light-emitting devices such as LEDs.

In the present invention, the electron configuration is controlled by bending a graphene sheet. The graphene sheet can be shaped into a curve by forming the sheet on a base film having a convex structure or a concave structure. The local electron states in the curved part can be formed by bending the graphene sheet. Thus, the same electron states as the cylinder or cap part of a nanotube can be realized, and the band gaps at the K points in the reciprocal lattice space can be formed.

In the reciprocal lattice space, an electron states in the cylinder part of a nanotube is defined by a plurality of line segment pairs. Metallic properties (for example, a nanotube having chirality of (9, 0) or the like) are shown when the line segments pass through the K points of the graphene sheet, while semiconductor-like properties (for example, a nanotube having chirality of (10, 0) or the like) are shown when the line segments do not pass through the K point of the graphene sheet. Similar to this, such a local electron states that the line segments do not pass through the K points of the graphene sheet can be realized by bending the graphene sheet.

A graphene sheet can be shaped into a curve on a substrate as described below. First, a base layer having a convex structure or a concave structure is prepared on the substrate by a photolithography technology. Then, the graphene sheet is selectively grown only on the surface of the base layer by a vapor-phase growth method using carbon-based gas as a raw material. Alternatively, a graphene sheet can also be prepared in a manner that transfers a substance having a size in the nanometer range only onto the surface of the base layer by a nano-transfer method using a graphite nano-rod prepared by a template method.

Effects of the Invention

According to the present invention, the electron configuration of a graphene sheet can be controlled by microfabrication technologies and the band gap thereof can be controlled.

EMBODIMENTS FOR CARRYING OUT THE INVENTION

Embodiments of the present invention will be described below with reference to the drawings.

Embodiment 1

Figure 1:
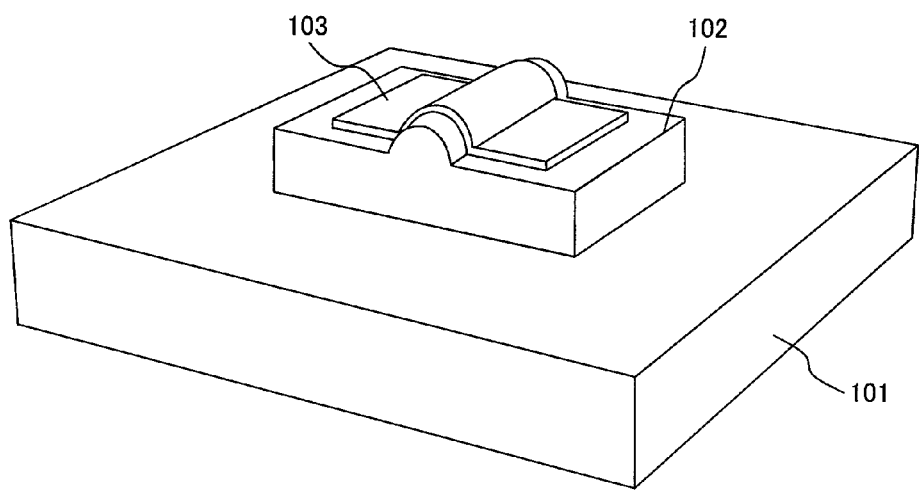
FIG. 1 is a schematic view showing one embodiment in which a graphene sheet is disposed along with a semi-cylindrical convex structure of a base layer.

Embodiment 1 will be described with reference to FIG. 1. FIG. 1 is a schematic view showing one embodiment in which a graphene sheet is disposed along a semi-cylindrical convex structure of a base layer.

A vapor-phase growth method, a photolithography process and a dry etching process are performed in this sequence on the surface of a substrate 101 (a Si substrate) to form a base layer 102 having a semi-cylindrical convex structure. The base layer 102 has a thickness of 10 nm and a material thereof is aluminium oxide. The semi-cylindrical structure has a diameter of 3 nm, a length in a transverse direction of 30 nm and a depth of 30 nm.

Then, graphene is selectively grown only on the surface of the base layer 102 by a vapor-phase growth method using acetylene as a raw material gas. A growth temperature of the vapor-phase growth is 400° C. and a growth time thereof is ten minutes. The graphene is not grown on the substrate 101, but selectively grown only on the aluminium oxide which is the base layer 102. After the selective growth, since the graphene is grown all over the surface of the base layer 102, a graphene layer 103 (a graphene sheet) is obtained by processing into a shape having a length in a transverse direction of 10 nm and a depth of 10 nm using the photolithography process and the dry etching process. By controlling the growth time, the graphene layer 103 can be not only a single layer but also a multiple-layer structure in which the number of the layers are controlled. In the case of the multiple-layer structure, the number of the layers is desirably less than ten. When the number of the layers is ten or more, properties of the graphene sheet are lost and the sheet shows properties similar to graphite (for example, metallic properties).

Alternatively, a nano-transfer method in which a substance having a size in the nanometer range is transferred onto a substrate also can be used in order to form the graphene layer 103. First, a nano-rod made of graphite is formed in this method. Then, a graphene layer 103 is formed by pressing the graphite nano-rod to the base layer 102 on the substrate. The graphite nano-rod can be prepared by dissolving pitch and inserting the pitch into a pore of anodized alumina and then highly crystallizing the pitch rod at 3000° C. after removing the alumina layer by wet etching. When this nano-transfer technology is used, the graphene layer 103 can be prepared at room temperature. Therefore, this method is suitable for preparing the graphene layer 103 on a flexible printed circuit (FPC) made of an organic material or the like.

As described above, the graphene layer 103 having the flat part and the part having the convex structure can be formed. The flat part acts as a metal-like material (for example, a band gap is equal to 0 eV), while the part of the convex structure acts as a semiconductor-like material (for example, a band gap is equal to 0.7 eV). Based on this structure, an electronic device shown in embodiment 5 (for example, a field effect transistor) or a light-receiving and light-emitting device shown in embodiment 6 (for example, an LED) can be prepared.

Although the silicon (Si) substrate is used in the present embodiment, substrates made of every material such as semiconductor substrates except this substrate and insulating substrates (for example, synthetic resin substrates) can be used. In addition, a flexible printed circuit made of an organic material can also be used.

Although acetylene gas is used as the raw material gas for selective growth of graphene in the present embodiment, carbon-based gases except acetylene (for example, ethylene, propylene and the like) can be used. Although aluminium oxide is used as the base layer 102 for selective growth, metal oxides except aluminium oxide such as silicon oxide and metal nitrides such as aluminium nitride and silicon nitride can be used.

Embodiment 2

Figure 2:
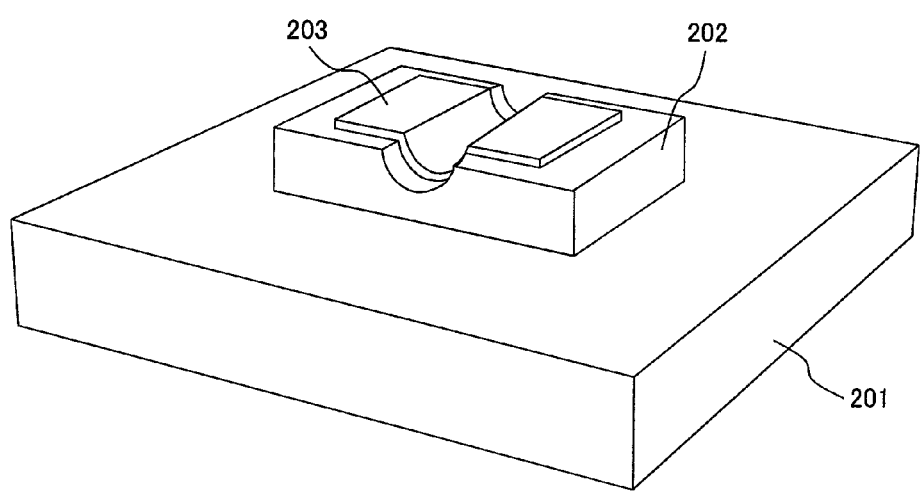
FIG. 2 is a schematic view showing one embodiment in which a graphene sheet is disposed along a semi-cylindrical concave structure of a base layer.

Embodiment 2 will be described with reference to FIG. 2.

Embodiment 2 is different from embodiment 1 in that a graphene layer 203 is formed on a base layer 202 after forming the base layer 202 having a semi-cylindrical concave structure. A method for forming the semi-cylindrical concave structure of the base layer 202 and a method for forming the graphene layer 203 are similar to the methods described in embodiment 1.

Embodiment 3

Figure 3:
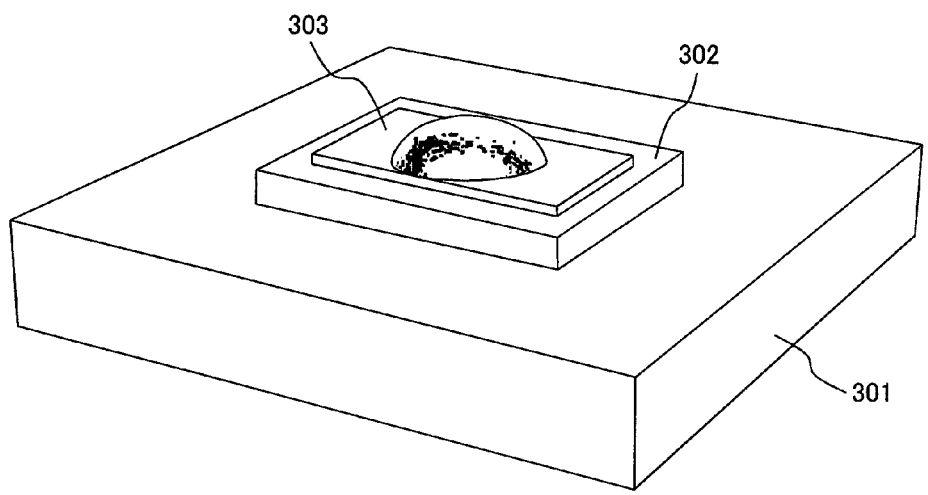
FIG. 3 is a schematic view showing one embodiment in which a graphene sheet is disposed along a hemispherical convex structure of a base layer.

Embodiment 3 will be described with reference to FIG. 3.

Embodiment 3 is different from embodiment 1 in that a graphene layer 303 is formed on a base layer 302 after forming the base layer 302 having a hemispherical convex structure. A method for forming the hemispherical convex structure of the base layer 302 and a method for forming the graphene layer 303 are similar to the methods described in embodiment 1.

Embodiment 4

Figure 4:
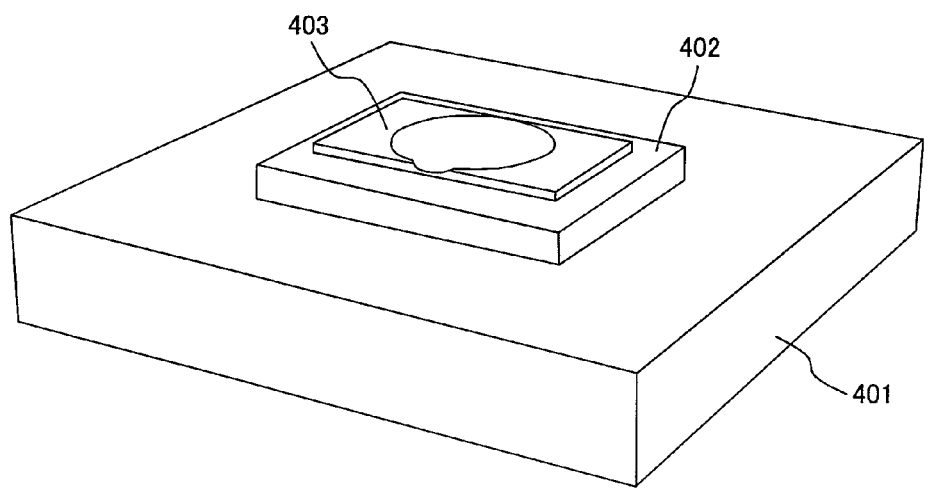
FIG. 4 is a schematic view showing one embodiment in which a graphene sheet is disposed along a hemispherical concave structure of a base layer.

Embodiment 4 will be described with reference to FIG. 4.

Embodiment 4 is different from embodiment 1 in that a graphene layer 403 is formed on a base layer 402 after forming the base layer 402 having a hemispherical concave structure. A method for forming the hemispherical concave structure of the base layer 402 and a method for forming the graphene layer 403 are similar to the methods described in embodiment 1.

Figure 7:
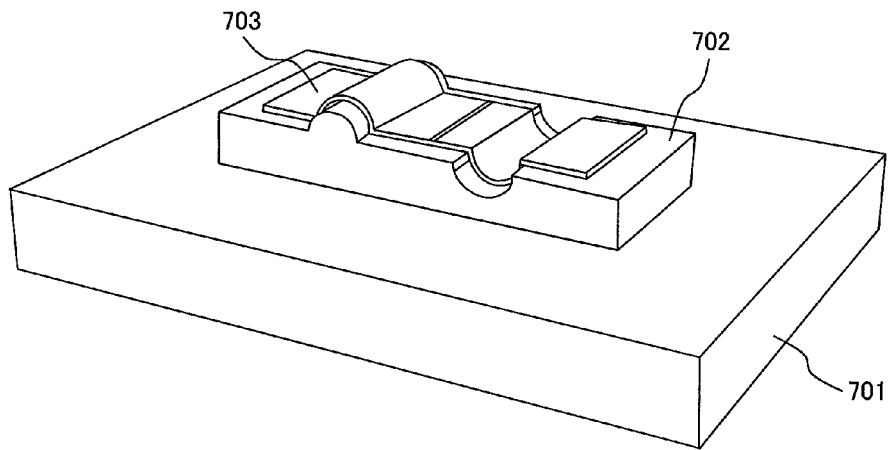
FIG. 7 is a schematic view showing one embodiment in which a graphene sheet is disposed along a semi-cylindrical convex structure and concave structure of a base layer.
Figure 8:
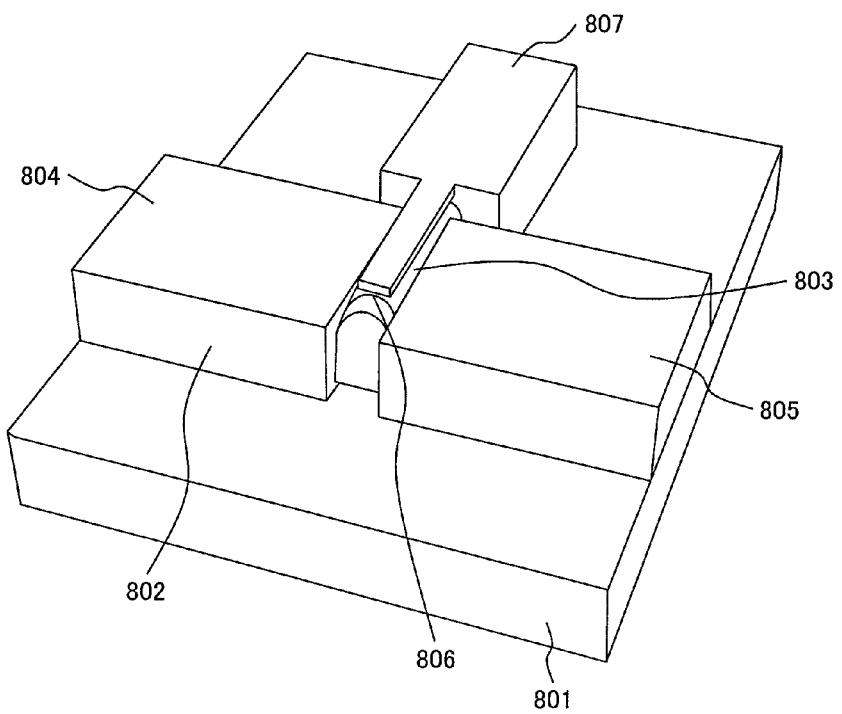
FIG. 8 is a schematic view showing the configuration of an electronic device according to embodiment 5.

Although the semi-cylindrical convex structure, the cylindrical concave structure, the hemispherical convex structure and the hemispherical concave structure are used in embodiment 1, embodiment 2, embodiment 3 and embodiment 4, respectively, every convex structure or concave structure except the structures described above can be used. As shown in FIG. 7, it is also possible that a plurality of concave structures and convex structures are combined to arrange these structures in serial or in parallel.

Embodiment 5

Figure 5:
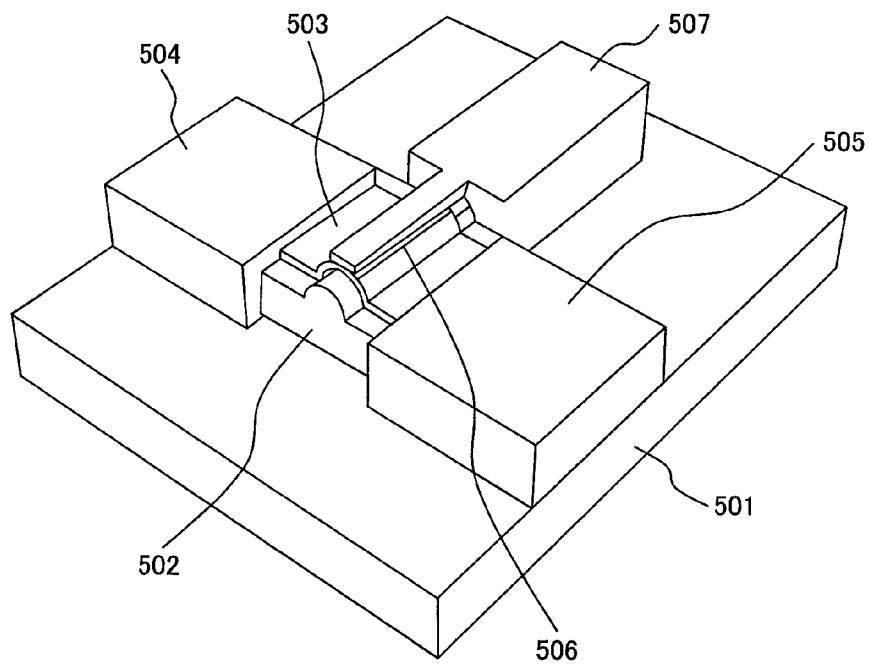
FIG. 5 is a schematic view showing configuration of an electronic device according to embodiment 5.

Embodiment 5 will be described with reference to FIG. 5. FIG. 5 is a schematic view showing configuration of an electronic device (a field-effect transistor).

In embodiment 5, a source electrode 504 was connected to one edge of a graphene layer 503, while a drain electrode 505 was connected to the other edge. A gate electrode 507 was disposed at a part of a convex structure of the graphene layer 503 through an insulating layer 506. Thus, a field effect transistor (FET) having a mobility of 20000 cm$^2$/Vs and a practical on/off ratio was possible to be prepared.

It is also possible that an electronic integrated circuit (for example, a circuit integrating a million of the field effect transistors and the like) is prepared by integrating these electronic devices on a semiconductor substrate such as Si substrate or a flexible printed circuit.

Although the electrodes are provided on the flat parts of the graphene layer 503 in FIG. 5, the electrodes can also be provided on the curved parts of the graphene layer 503 as shown in FIG. 7. Thus, a connection having a lower resistance can be obtained, because the graphene layer is electrically connected to the electrodes not through the part of the graphene layer having the largest curvature at the boundary between the curved part and the flat part.

Embodiment 6

Figure 6:
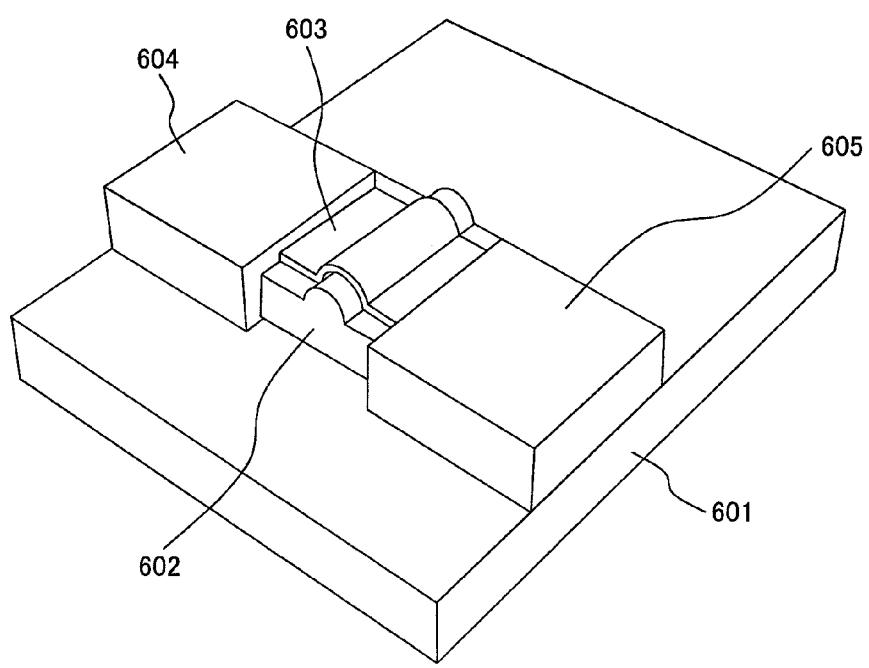
FIG. 6 is a schematic view showing a light-receiving and light-emitting device according to embodiment 6.

Embodiment 6 will be described with reference to FIG. 6. FIG. 6 is a schematic view showing configuration of a light-receiving and light-emitting device.

In embodiment 6, the light-receiving and light-emitting device was prepared by connecting a positive electrode 604 to one edge of a graphene layer 603 and connecting a negative electrode 605 to the other edge. Light emitting wavelength and light-receiving wavelength is in approximately a near-infrared region (a wavelength of 1200-1800 nm).

By integrating such light-receiving and light-emitting devices on a semiconductor substrate (such as a Si substrate) or a flexible printed circuit, an optical integrated circuit (for example, a circuit prepared by monolithically integrating ten thousand of the light-emitting devices and ten thousand of the light-receiving devices) can be prepared.

In addition, by integrating such light-receiving and light-emitting devices and the field effect transistors described in embodiment 6 on a semiconductor substrate or a flexible printed circuit, an electronic/optical integrated circuit (for example, a circuit prepared by monolithically integrating a million of the field-effect transistor, ten thousand of the light-emitting devices and ten thousand of the light-receiving devices), can also be prepared.

DESCRIPTION OF THE REFERENCE NUMERALS

101, 201, 301, 401, 501, 601, 701 and 801: Substrate
102, 202, 302, 402, 502, 602, 702 and 802: Base layer
103, 203, 303, 403, 503, 603, 703 and 803: Graphene layer
504 and 804: Source electrode
505 and 805: Drain electrode
506 and 806: Insulating layer
507 and 807: Gate electrode
604: Positive electrode
605: Negative electrode

The invention claimed is:

1. An electronic device comprising:
   a substrate;
   a base layer disposed on the substrate and including at least one of a convex structure and a concave structure; and
   a graphene sheet layer, including at least one graphene sheet, disposed on the at least one of a convex structure and a concave structure of the base layer; and
   either of:
   (a) a source electrode connected to an edge of the graphene sheet layer, and a drain electrode connected to an opposite edge of the graphene sheet layer, or
   (b) a positive electrode, connected to an edge of the graphene sheet layer, and a negative electrode, connected to an opposite edge of the graphene sheet layer.

2. The electronic device according to claim 1, wherein a vapor-phase growth method using carbon-based gas is used to selectively grow the graphene sheet layer to be disposed on the base layer.

3. The electronic device according to claim 1, wherein a nano-transfer method, in which a substance having particles with a size in the nanometer range is transferred, is used to grow the graphene sheet layer to be disposed on the base layer.

4. The electronic device according to claim 1, wherein the number of graphene sheets in the graphene sheet layer is less than ten.

5. The electronic device according to claim 1,
   wherein the electronic device includes: a positive electrode, and a negative electrode.

6. The electronic device according to claim 1,
   wherein the electronic device includes: a source electrode, and a drain electrode.

7. The electronic device according to claim 5,
   wherein the edge of the graphene sheet layer connected to the positive electrode is about parallel to the opposite edge of graphene sheet connected to the negative electrode.

8. The electronic device according to claim 6,
   wherein the edge of the graphene sheet layer connected to the source electrode is about parallel to the opposite edge of graphene sheet connected to the drain electrode.

9. The electronic device according to claim 6, further comprising:
   a gate electrode, separated from the graphene sheet layer by an insulating layer.

10. The electronic device according to claim 1,
    wherein a channel of the electronic device is provided at the portion of the graphene sheet layer disposed above the at least one of a convex structure and a concave structure of the base layer.

11. The electronic device according to claim 1,
    wherein the at least one of a convex structure and a concave structure of the base layer includes: a semi-cylindrical convex structure.

12. The electronic device according to claim 1,
    wherein the base layer consists of: a semi-cylindrical convex structure.

13. The electronic device according to claim 1,
    wherein the at least one of a convex structure and a concave structure of the base layer includes: a semi-cylindrical concave structure.

14. The electronic device according to claim 1,
    wherein the at least one of a convex structure and a concave structure of the base layer includes: a hemispherical convex structure.

15. The electronic device according to claim 1,
    wherein the at least one of a convex structure and a concave structure of the base layer includes: a hemispherical concave structure.

16. The electronic device according to claim 1,
    wherein the at least one of a convex structure and a concave structure of the base layer includes: both a semi-cylindrical convex structure and a semi-cylindrical concave structure.

* * * * *